United States Patent
Suzuki

(10) Patent No.: US 7,791,317 B2
(45) Date of Patent: Sep. 7, 2010

(54) BATTERY PACK AND METHOD OF CALCULATING DETERIORATION LEVEL THEREOF

(75) Inventor: Isao Suzuki, Saitama (JP)

(73) Assignee: Sony corporation, Tokyo (JP)

( * ) Notice: Subject to any disclaimer, the term of this patent is extended or adjusted under 35 U.S.C. 154(b) by 472 days.

(21) Appl. No.: 11/832,476

(22) Filed: Aug. 1, 2007

(65) Prior Publication Data

US 2008/0054908 A1  Mar. 6, 2008

(30) Foreign Application Priority Data

Aug. 1, 2006 (JP) .......................... P2006-210139

(51) Int. Cl.
*H01M 10/44* (2006.01)
*H01M 10/46* (2006.01)
(52) U.S. Cl. ...................................... 320/139
(58) Field of Classification Search ................ 320/107, 320/125, 130, 132, 137, 139, 141, 149; 324/426, 324/430, 433; 702/57, 63, 64
See application file for complete search history.

(56) References Cited

U.S. PATENT DOCUMENTS

| | | | |
|---|---|---|---|
| 5,576,608 A | 11/1996 | Nagai et al. | |
| 5,637,981 A | 6/1997 | Nagai et al. | |
| 6,842,708 B2 | 1/2005 | Odaohhara | |
| 2003/0030414 A1* | 2/2003 | Suzuki | 320/136 |
| 2003/0085690 A1* | 5/2003 | Shiojima | 320/164 |

FOREIGN PATENT DOCUMENTS

| | | |
|---|---|---|
| JP | 64-081628 | 3/1989 |
| JP | 6-325795 | 11/1994 |
| JP | 9-259934 | 10/1997 |
| JP | 2001-228226 | 8/2001 |
| JP | 2002-280082 | 9/2002 |
| JP | 2002-330547 | 11/2002 |
| JP | 2004-104862 | 4/2004 |
| JP | 2004-257781 | 9/2004 |
| JP | 2004-274849 | 9/2004 |
| JP | 2004-282929 | 10/2004 |
| JP | 2006-015896 | 1/2006 |

\* cited by examiner

*Primary Examiner*—Edward Tso
(74) *Attorney, Agent, or Firm*—K&L Gates LLP

(57) ABSTRACT

A battery pack is disclosed. The battery pack includes at least one battery, a switch section, a measurement section, and a deterioration level calculation section. The switch section turns on and off charging to the battery. The measurement section measures an open circuit voltage of the battery. The deterioration level calculation section calculates the deterioration level of the battery based on the open circuit voltage measured by the measurement section after the switch section has repeatedly turned on and off the charging 10 times or more.

6 Claims, 6 Drawing Sheets

BATTERY PACK AND METHOD OF CALCULATING DETERIORATION LEVEL THEREOF

CROSS REFERENCES TO RELATED APPLICATIONS

The present application claims priority to Japanese Patent Application JP 2006-210139 filed in the Japanese Patent Office on Aug. 1, 2006, the entire contents of which is being incorporated herein by reference.

BACKGROUND

The present application relates to a battery pack and a method of calculating the deterioration level thereof, in particular, to a battery pack that allows the deterioration level of a battery to be calculated.

In recent years, as portable electronic units have been widespread, there has been a need for large-capacity and lightweight secondary batteries. As an exemplary secondary battery that satisfies such a need, a lithium ion secondary battery that uses lithium as an electrode reactive substance has become attractive in the field.

When a lithium ion secondary battery becomes deteriorated, its operation time becomes short. Thus, it is desired to calculate the deterioration level of a battery and indicate the calculated result. As an exemplary method of calculating the deterioration level of a battery, which satisfies such a demand, the charging of the battery is turned off, its open circuit voltage is measured, and then its deterioration level is calculated based on the open circuit voltage. This method is disclosed for example in Japanese Patent Application Laid-Open No. 2001-228226 (referred to as Patent Document 1).

However, since the open circuit voltage does not become stable in such a method, it is difficult to accurately calculate the deterioration level of the battery. As factors that cause the open circuit voltage of the battery to fluctuate, it is likely that there are for example ambient environment and resistance of the connection portion. Thus, if the charging off time is increased, the open circuit voltage may become stable. As a matter of practice, however, if the charging stop time is long, the charging time would become long.

SUMMARY

In view of the foregoing, it would be desirable to provide a battery pack that allows the deterioration level of the battery to be more accurately calculated without an increase of the charging time than the related art and a method of calculating the deterioration level thereof.

According to an embodiment, there is provided a battery pack. The battery pack includes at least one battery, a switch section, a measurement section, and a deterioration level calculation section. The switch section turns on and off charging to the battery. The measurement section measures an open circuit voltage of the battery. The deterioration level calculation section calculates the deterioration level of the battery based on the open circuit voltage measured by the measurement section after the switch section has repeatedly turned on and off the charging 10 times or more.

According to an embodiment, there is provided a method of calculating a deterioration level. After charging to at least one battery is turned on and off 10 times or more, an open circuit voltage of the battery is measured. The deterioration level of the battery is calculated based on the open circuit voltage.

In an embodiment, after the charging to at least one battery is turned on and off 10 times or more, the open circuit voltage of the battery is measured. Thus, after the open circuit voltage of the battery becomes stable, the open circuit voltage can be measured.

In an embodiment, it is preferred that when the relative capacity of the battery is less than 70%, the deterioration level calculation section calculates the deterioration level of the battery based on the open circuit voltage measured by the measurement section. In this specification, the relative capacity represents the remaining capacity of the battery pack to the full charge capacity of the battery pack. Thus, when the relative capacity of the battery is less than 70%, since the charge current is large, the difference between the close circuit voltage (on state voltage) and the open circuit voltage (off state voltage) becomes large during charging. Thus, the voltage can be more accurately measured than the related art.

In an embodiment, it is preferred that the switch section turn on and off the charging to the battery at intervals of one second or less. When the charging is turned on and off at intervals of one second or less, the open circuit voltage can be measured with less influence of polarization.

As described above, according to an embodiment, the open circuit voltage can be more accurately measured without an increase of the charging off time than the related art. Thus, the deterioration level of the battery can be more accurately measured without an increase of the charging time than the related art.

These and other objects, features and advantages will become more apparent in light of the following detailed description of a best mode embodiment thereof, as illustrated in the accompanying drawings.

Additional features and advantages are described herein, and will be apparent from, the following Detailed Description and the figures.

DETAILED DESCRIPTION (1) Structure of Battery Pack

Next, with reference to FIG. 1, a structure of a battery pack according to an embodiment will be described.

Figure 1:
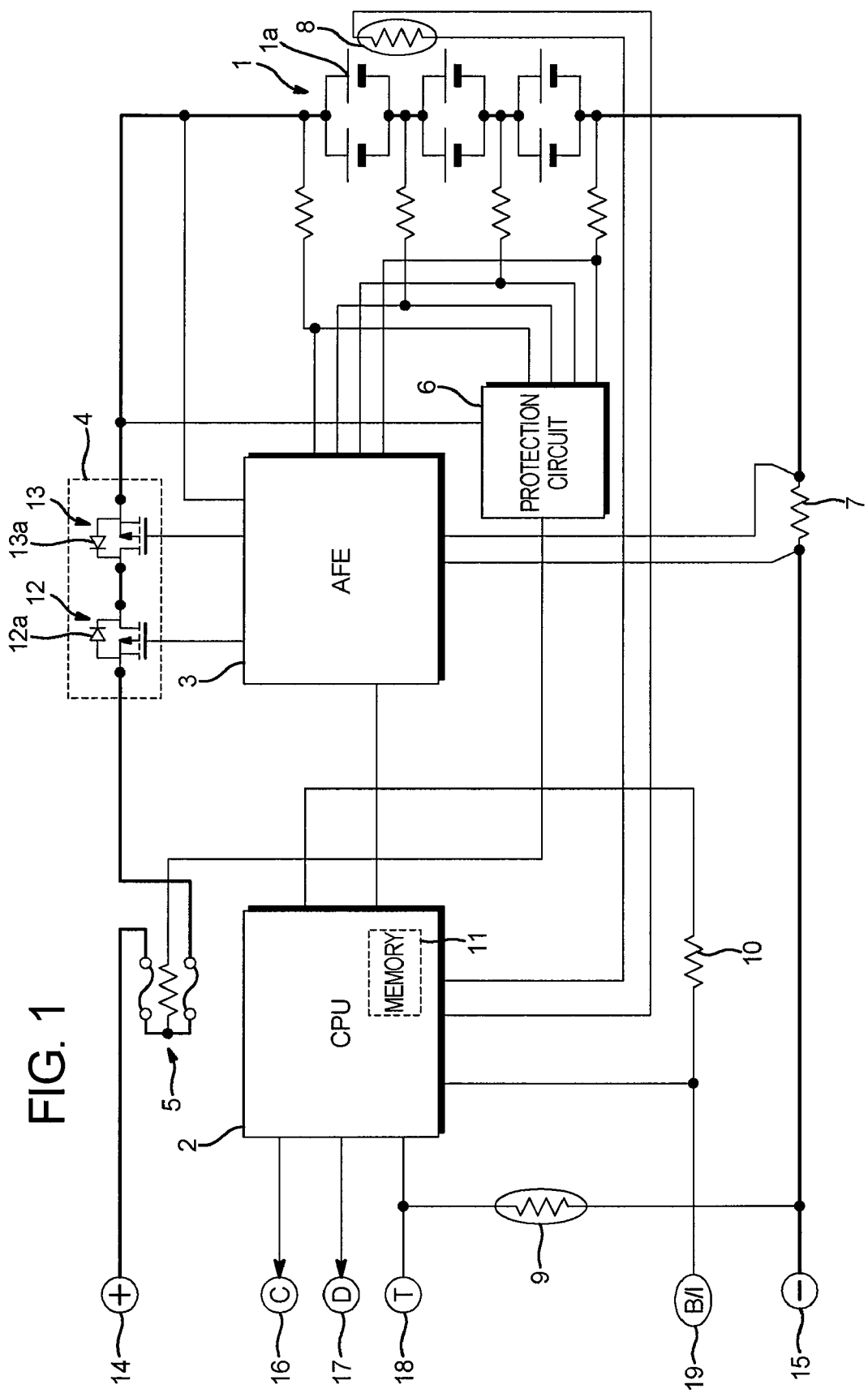
FIG. 1 is a block diagram showing an exemplary structure of a battery pack according to an embodiment.

As shown in FIG. 1, the battery pack includes an assembled battery 1, a CPU (Central Processing Unit) 2, an AFE (Analog Front End) 3, a switch section (charging and discharging control FETs) 4, a fuse 5, a protection circuit 6, a current detection resistor 7, temperature detection devices 8 and 9, and an identification resistor 10.

The battery pack has a cathode terminal 14 and an anode terminal 15. When the battery pack is charged, the cathode terminal 14 and the anode terminal 15 are connected to a cathode terminal and an anode terminal of a charging device, respectively, and the battery pack is charged by the charging device. On the other hand, when an electronic unit is used, the cathode terminal 14 and the anode terminal 15 of the battery pack are connected to a cathode terminal and an anode terminal of the electronic unit, respectively, and the battery pack is discharged by the electronic unit.

The assembled battery 1 is composed of a plurality of secondary batteries 1*a* connected in parallel and/or in series. The secondary batteries 1*a* are for example lithium ion secondary batteries. FIG. 1 shows an exemplary case of which six secondary batteries 1*a* are connected in 3S2P (3 series, 2 parallel).

The protection circuit 6 measures the voltage of the assembled battery 1 and the voltage of each of the secondary batteries 1*a* that compose the assembled battery 1. When each of the measured voltages exceeds a predetermined voltage, the protection circuit 6 blows the fuse 5. The temperature detection device 8 is for example a thermistor and disposed in the vicinity of the plurality of batteries. The temperature detection device 8 measures the temperature of the assembled battery 1 and supplies the measured temperature to the CPU 2. On the other hand, the temperature detection device 9 is for example a thermistor, measures the temperature of the battery pack, and supplies the measured temperature to an electronic unit such as a note-type personal computer (hereinafter, referred to as a note-type PC) through a connection terminal 18. The identification resistor 10 is used by the electronic unit such as the note-type PC through a connection terminal 19 to identify the type of the battery pack and to determine whether or not the battery pack can be connected to the unit.

The switch section 4 includes a charging control FET (Field Effect Transistor) 12 and a discharging control FET 13. When the battery voltage becomes an overcharge detection voltage, the switch section 4 turns off the charging control FET 12 to prevent the charge current from flowing. After the charging control FET 12 is turned off, the assembled battery 1 can only discharge through a parasitic diode 12*a*. When the battery voltage becomes an overdischarge detection voltage, the switch section 4 turns off the discharging control FET 13 to prevent the discharge current from flowing. After the discharging control FET 13 is turned off, the assembled battery 1 can only charge through a parasitic diode 13*a*.

The AFE 3 measures the voltage of the assembled battery 1 and the voltage of each of the secondary batteries 1*a* that compose the assembled battery 1, converts the measured voltages as analog data into digital data, and supplies the digital data to the CPU 2. The AFE 3 measures the current that flows in the current detection resistor 7 and supplies the measured current to the CPU 2.

The CPU 2 monitors the battery temperature with the temperature detection devices 8 and 9. In addition, the CPU 2 has a memory 11 that is for example an EEPROM (Electrically Erasable and Programmable Read Only Memory), which is a nonvolatile memory. The memory 11 stores information such as an initial full charge capacity and a full charge capacity corrected based on the deterioration level of the secondary batteries 1*a* (hereinafter referred to as the corrected full charge capacity).

The CPU 2 calculates the deterioration level based on for example a closed circuit voltage CCV, an open circuit voltage OCV, and a current I supplied for example from the AFE 3 and updates the corrected full charge capacity stored in the memory 11 based on the calculated deterioration level.

Instead, the CPU 2 may calculate the deterioration level based on the closed circuit voltage CCV, the open circuit voltage OCV, and the current I supplied from the AFE 3 and a temperature measured by the temperature detection device 8 and update the corrected full charge capacity stored in the memory 11 based on the calculated deterioration level. The deterioration level can be calculated by a known calculating method. The CPU 2 may supply the calculated deterioration level to an electronic unit such as a note-type PC through communication terminals 16 and 17. The electronic unit that has been supplied with the deterioration level may display it on a display section of a liquid crystal display device disposed in the electronic unit.

The CPU 2 controls the switch section 4 through the AFE 3 to turn on and off the charge current. When one of the secondary batteries 1*a* becomes the overcharge detection voltage or one of the secondary batteries 1*a* becomes the overdischarge detection voltage or lower, the CPU 2 sends a control signal to the switch section 4 through the AFE 3 to prevent the batteries from overcharging or overdischarging. It is specified that the overcharge detection voltage and the overdischarge detection voltage of lithium ion secondary batteries be for example 4.2 V±0.5 V and 2.4 V±0.1 V, respectively.

Figure 2:
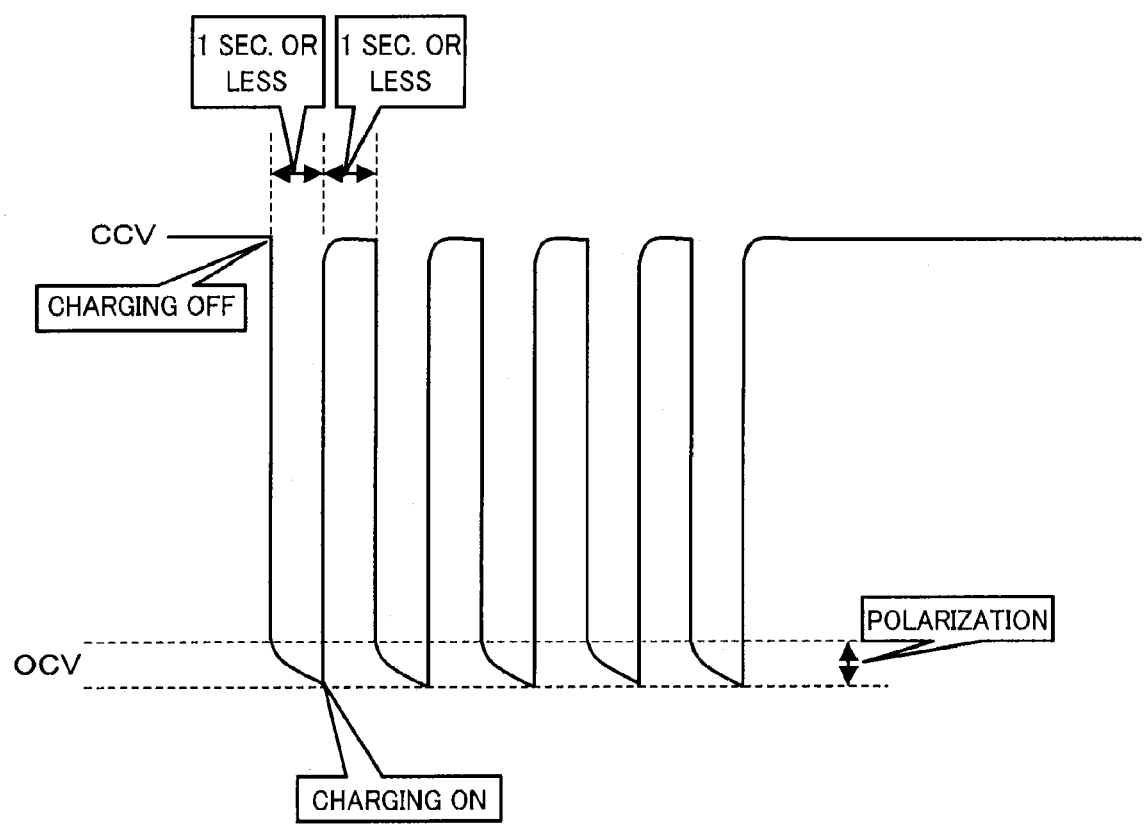
FIG. 2 is a schematic diagram showing waveforms of voltages in charging on and off states of the battery pack according to the embodiment.

The CPU 2 controls the switch section 4 through the AFE 3 and repeatedly turns on and off the charge current as shown in FIG. 2. It is preferred that after repeatedly turning on and off the charge current 10 times or more, the CPU 2 calculate the deterioration level of the batteries based on the open circuit voltage OCV. This is because when the charge current is repeatedly turned on and off 10 times or more, the open circuit voltage OCV of the secondary batteries 1*a* becomes stable.

It is preferred that the CPU 2 calculate the deterioration level of the batteries based on the open circuit voltage OCV measured in a low battery capacity state of which the relative capacity is less than 70%. When the relative capacity is 70% or less, the charge current becomes large. Thus, while the batteries are being charged, the difference between the closed circuit voltage CCV (the voltage in the on state) and the open circuit voltage OCV (the voltage in the off state) becomes large. Thus, the voltages can be more accurately measured than otherwise.

It is preferred that the CPU 2 repeatedly turn on and off the charge current at short intervals of one second or less as shown in FIG. 2. When the charge current is turned off, after the voltages sharply drop, they gradually drop due to the effect of polarization. Thus, when the charge current is turned on and off at short periods of one second or less, the voltages can be measured with less influence of polarization.

(2) Structure of Secondary Batteries

Next, with reference to FIGS. 3 and 4, an exemplary structure of the secondary batteries 1 a will be described.

Figure 3:
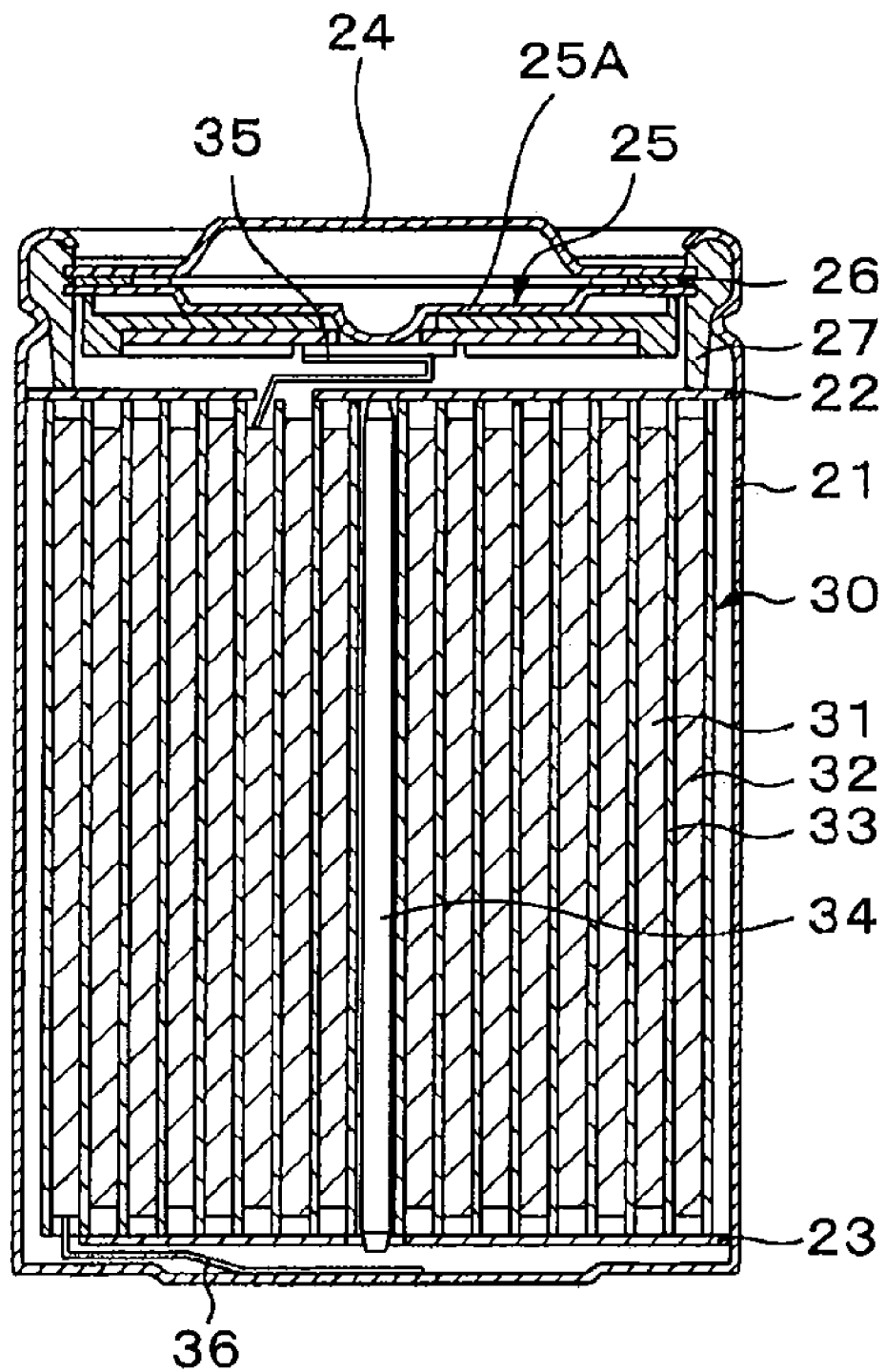
FIG. 3 is a sectional view showing an exemplary structure of a secondary battery disposed in the battery pack according to the embodiment.

As shown in FIG. 3, the secondary batteries 1*a* are of so-called cylinder type. Disposed in a nearly hollow cylindrical battery can 21*a* is a winded electrode member 30 composed by winding a strip-shaped cathode 31 and a strip-shaped anode 32 around a separator 33. The separator 33 is impregnated with an electrolysis solution, which is a liquid electrolyte. The battery can 21 is made of for example steel Fe that is plated with nickel Ni. One end of the battery can 21 is closed and the other end is open. A pair of insulation plates 22 and 23 are disposed in the battery can 21 such that the insulation plates 22 and 23 sandwich the winded electrode member 30 in the direction perpendicular to the roll circumferential surface.

Disposed on the open end portion of the battery can 21 is a battery lid 24. Disposed inside the battery lid 24 are a safety valve mechanism 25 and a PTC (Positive Temperature Coefficient) device 26 that are caulked through a gasket 27. The battery can 21 is airtightly sealed. The battery lid 24 is made of for example the same material as the battery can 21. The safety valve mechanism 25 is electrically connected to the battery lid 24 through the PTC device 26. The safety valve mechanism 25 is structured such that when the inner pressure of the battery exceeds a predetermined pressure due to an inner shortcircuit or external heating, a disc plate 25A turns over, resulting in causing the battery lid 24 and the winded electrode member 30 to be electrically disconnected. The PTC device 26 has a characteristic of which as its temperature rises, its resistance increases, resulting in restricting a large current that flows in the battery and preventing it from abnormally heating. The gasket 27 is made from for example an insulation material and is coated on its surface with asphalt.

The winded electrode member 30 is wound for example around a center pin 34. A cathode lead 35 made of for example aluminum Al is connected to the cathode electrode 31 of the winded electrode member 30 and an anode lead 36 made of for example nickel Ni is connected to the anode 32. The cathode lead 35 is welded to the safety valve mechanism 25 such that the cathode lead 35 is electrically connected to the battery lid 24. The anode lead 36 is welded to the battery can 21 such that the anode lead 36 is electrically connected to the battery can 21.

Figure 4:
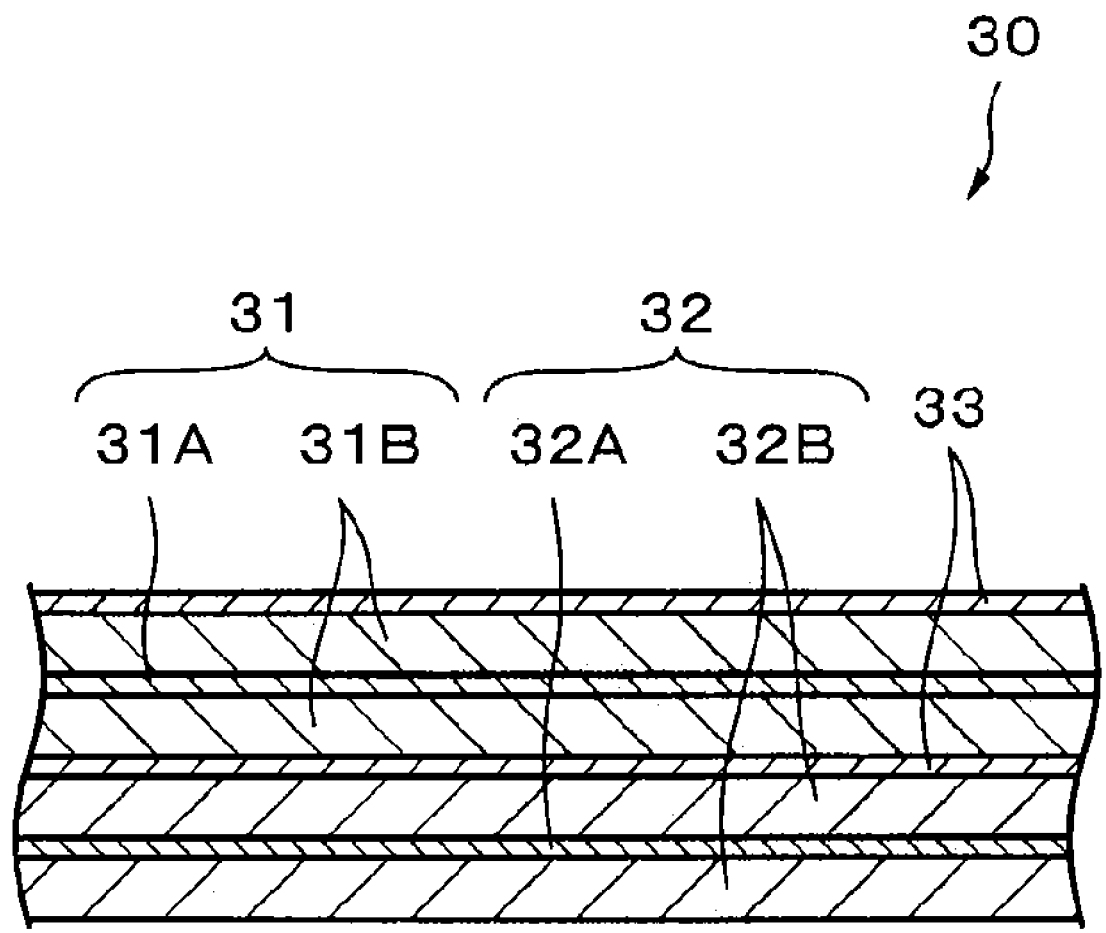
FIG. 4 is an enlarged sectional view showing the exemplary structure of the secondary battery disposed in the battery pack according to the embodiment.

As shown in FIG. 4, the winded electrode member 30 is composed by winding the cathode 31 and the anode 32 through the separator 33.

The cathode 31 has for example a cathode current collector 31A and two cathode active material layers 31B formed on both surfaces of the cathode current collector 31A. The cathode current collector 31A is made from a metal foil such as aluminum foil.

The cathode active material layers 31B contain a cathode active material and if necessary a conductive material such as a carbon material and a binder such as polyvinylidene fluoride or poly(tetrafluoroethylene).

Examples of the cathode active material include composite oxides of lithium and transition metals. Specifically, $LiCoO_2$, $LiNiO_2$, $LiMn_2O_4$, or the like can be used. Instead, a solid solution of which a part of a transition metal is substituted with another element may be used. For example, $LiNi_{0.5}Co_{0.5}O_2$, $LiNi_{0.8}Co_{0.2}O_2$, $LiNi_{0.5}Co_{0.2}Mn_{0.3}O_2$, or the like may be used.

The anode 32 has for example an anode current collector 32A and two anode active material layers 32B formed on both surfaces of the anode current collector 32A. The anode current collector 32A is made from a metal foil such as copper foil.

The anode active material layers 32B contain at least one type of an anode material that can adsorb and release lithium. If necessary, the anode active material layers 32B may contain a conductive material and a binder.

Examples of the anode active material include lithium metal, a lithium alloy, a carbon material that can dope or dedope lithium, and a composite material of a metal material and a carbon material. Specifically, examples of the carbon materials that can dope and dedope lithium include graphites, non-easy-graphitizable carbon, and easy-graphitizable carbon. Examples of the graphites include artificial graphites such as mesophase carbon microbeads and carbon fiber and natural graphite. Examples of materials alloyed with lithium include various types of metals such as tin Sn, cobalt Co, indium In, aluminum Al, silicon Si, and their alloys. Metal lithium may be used as a rolled Li metal film, rather than a coating film of which a binder is added to lithium powder.

The separator 33 is not limited to a particular type as long as the separator 33 is electrically stable, chemically stable against a cathode active material, an anode active material, and an electrolysis solution, and electrically non-conductible. Examples of the separator 33 include a polymeric non-woven fabric, a porous film, a glass or ceramic fiber film, and their laminates. It is preferred that the separator 33 be made from a porous polyolefin film. Instead, a composite material of which a heat resistant material made from polyimide, glass fiber, or ceramic fiber is added to a porous polyolefin film may be used.

The electrolysis solution contains an electrolysis salt and a solvent that dissolves the electrolysis salt. Examples of the electrolysis salt include lithium salts such as $LiClO_4$, $LiPF_6$, $LiBF_4$, $LiN(SO_2CF_3)_2$, $LiN(SO_2C_2F_5)_2$, and $LiAsF_6$. Although one type of an electrolysis salt is used, a mixture of two types of these electrolysis salts may be used.

Examples of the solvent include lactone-type solvents such as γ-butyrolactone, γ-valerolactone, δ-valerolactone, and ε-caprolactone; etheylen carbonate type solvents such as ethylene carbonate, propylene carbonate, butylene carbonate, vinylene carbonate, dimethyl carbonate, ethylmethyl carbonate, and diethyl carbonate; ether type solvents such as 1,2-dimethoxyethane, 1-ethoxy-2-methoxythane, 1,2-diethoxyethane, tetrahydrofuran, and 2-methyltetrahydrofuran; nitrile type solvents such as acetonitrile; sulforun type solvents; phosphoric acid; ester phosphate solvents; and nonaqueous solvents such as pyrolidones. One type of these solvents may be used. Instead, two types of these solvents may be used.

(3) Operation of Battery Pack

Figure 5:
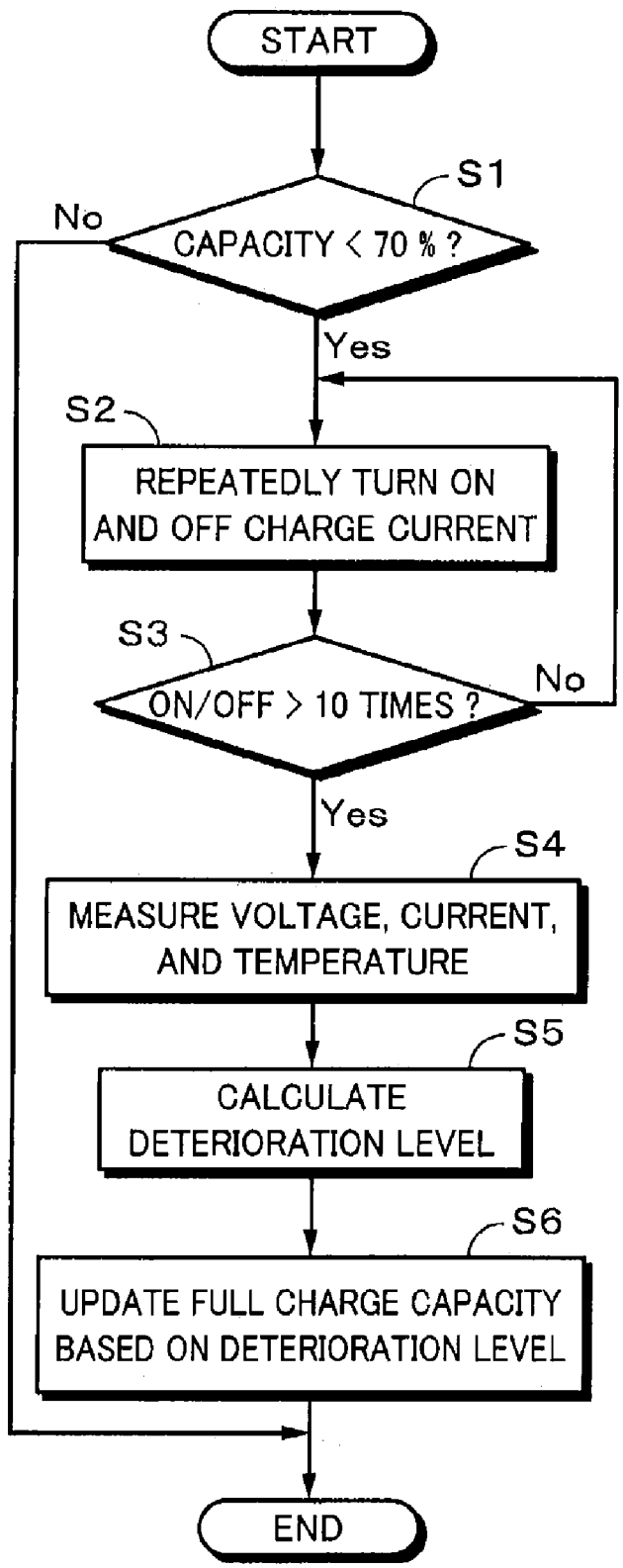
FIG. 5 is a flow chart describing an exemplary operation of the battery pack according to the embodiment.

Next, with reference to FIG. 5, an operation of the battery pack according to the embodiment will be described.

At step S1, the CPU 2 determines whether or not the relative capacity of the secondary batteries 1a is less than 70%. When the determined result at step S1 denotes that the relative capacity is less than 70%, the flow advances to step S2. In contrast, when the determined result at step S1 denotes that the relative capacity is not less than 70%, the process is completed.

At step S2, the CPU 2 controls the switch section 4 through the AFE 3 to repeatedly turn on and off the charge current. At step S3, the CPU 2 determines whether or not the charge current has been turned on and off 10 times or more. When the determined result at step S3 denotes that the charge current has been turned on and off 10 times or more, the flow advances to step S4. In contrast, when the determined result at step S3 denotes that the charge current has not been turned on and off 10 times or more, the flow returns to step S2.

At step S4, the CPU 2 measures the closed circuit voltage CCV, the open circuit voltage OCV, and the current I through the AFE 3 and if necessary the temperature T using the temperature detection device 8. Thereafter, the flow advances to step S5. At step S5, the CPU 2 calculates the deterioration level based on the values measured at step S4. For example, the CPU 2 can calculate (CCV−OCV)/1=internal resistance (R1) based on for example the values measured at step S4. In addition, the CPU 2 can calculate deterioration level=(R1−R2)/R2 based on the internal resistance (R2) obtained upon manufacturing of the battery pack. The internal resistance (R2) obtained upon manufacturing of the battery pack is prestored for example in the memory 11.

Thereafter, the flow advances to step S6. At step S6, the CPU 2 updates the corrected full charge capacity stored in the memory 11 based on the deterioration level calculated at step S5. For example, the CPU 2 reads the initial full charge capacity from the memory 11, multiplies the initial full charge capacity by the deterioration level (%), corrects the initial full charge capacity, and updates the corrected full charge capacity stored in the memory 11 with the calculated corrected full charge capacity.

As described above, in the battery pack according to this embodiment, after the charge current is turned on and off 10 times or more and then the open circuit voltage OCV becomes stable, the open circuit voltage OCV is measured. Based on the open circuit voltage OCV, the deterioration level of the battery is calculated. Based on the deterioration level of the battery, the full charge capacity is corrected. Thus, the original full charge capacity of the battery can be accurately obtained. As a result, since the secondary batteries 1a can be optimally controlled, the capacity of the secondary batteries 1a can be fully used without excessive deterioration thereof.

EXAMPLE

Next, with an example, the present application will be specifically described. However, the present application is not limited to the following example.

First, a lithium ion secondary battery was manufactured in the following manner.

LiCoO2 (96 wt %) as a cathode active material, Ketchen black (1 wt %) as a conductive material, and polyvinylidene fluoride (3 wt %) as a binder were mixed. As a result, a cathode mixture was obtained. Thereafter, the cathode mixture was dispersed into N-methyl-2-pyrrolidone. As a result, cathode mixture slurry was obtained. The cathode mixture slurry was coated on a cathode current collector made from aluminum and then dried. The resultant cathode current collector was compressed by a roller press at a constant pressure. As a result, a strip-shaped cathode 31 was obtained.

Thereafter, graphite (94 wt %) as an anode active material and polyvinylidene fluoride (3 wt %) as a binder were dispersed into N-methyl-2-pyrrolidone. As a result, anode mixture slurry was obtained. The anode mixture slurry was uniformly coated on strip-shaped copper foil as an anode current collector and then dried. The resultant anode current collector was compressed at a constant pressure. As a result, a strip-shaped anode 32 was obtained.

The strip-shaped cathode and anode manufactured in the foregoing manner were rolled through a separator made from porous polyethylene film having a thickness of 20 μm. As a result, a convolutional winded electrode member was obtained.

Thereafter, the convolutional winded electrode member was housed in a nickel-plated steel battery can. Thereafter, insulation plates were placed on both an upper surface and a lower surface of the convolutional winded electrode member. A cathode lead made of aluminum was derived from the cathode current collector and welded to a battery lid. An anode lead made of nickel was derived from the anode current collector and welded to the battery can.

Thereafter, electrolytic solution was prepared by dissolving $LiPF_6$ in a mixture of ethylene carbonate and dimethyl carbonate at a volume ratio of 1 to 1 such that the concentration of LiPF6 became 1 mol/l. The resultant electrolytic solution was poured into the battery can. Thereafter, the battery can was caulked by a gasket on which asphalt was coated such that a safety valve mechanism having a current shutoff mechanism, a PTC device, and the battery lid were secured and the airtightness of the battery was maintained. As a result, a cylindrical lithium ion battery having a diameter of 18 mm and a height of 65 mm was manufactured.

Figure 6:
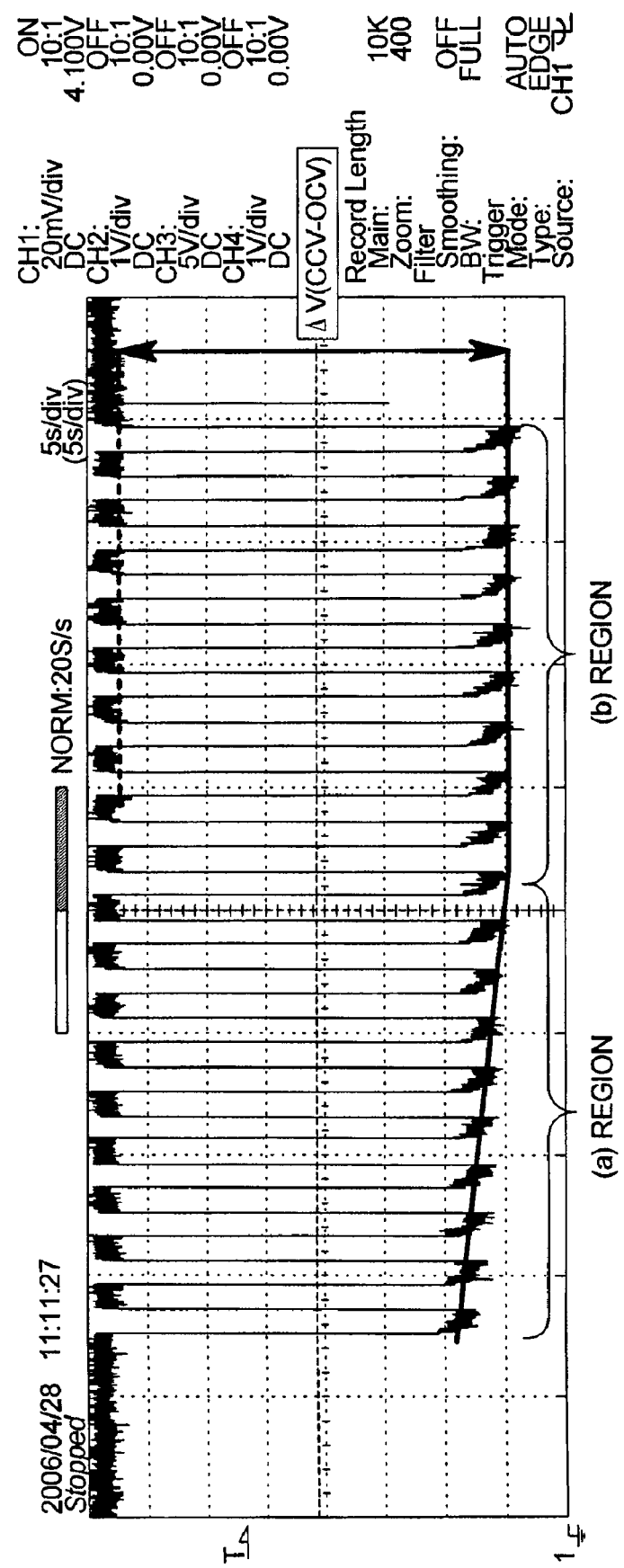
FIG. 6 is a schematic diagram showing waveforms in on and off states of a charge current in a battery pack according to an embodiment.

Thereafter, with the lithium ion secondary batteries manufactured in the foregoing manner, the battery pack shown in FIG. 1 was manufactured. The manufactured battery pack was charged. In a region of which the relative capacity was less than 70%, the charge current was repeatedly turned on and off at intervals of one second and waveforms in the on and off states of the charge current were measured. FIG. 6 shows the waveforms in the on and off states of the charge current.

FIG. 6 shows that in (a) region of which the charge current is turned on and off less than 10 times, the open circuit voltage OCV is unstable and that in (b) region of which the charge current is turned on and off 10 times or more, the open circuit voltage OCV is stable. Thus, FIG. 6 shows that it is preferred that in the state that the relative capacity is less than 70%, the deterioration level of the battery be calculated based on the open circuit voltage OCV measured after the charge current is turned on and off 10 times or more at intervals of one second or less.

It should be understood by those skilled in the art that various modifications, combinations, sub-combinations and alternations may occur depending on design requirements and other factors insofar as they are within the scope of the appended claims or the equivalents thereof.

The values of the foregoing embodiment are just exemplary. When necessary, different values may be used.

In the foregoing embodiment, an example of which the present application is applied to a nonaqueous electrolysis secondary battery containing a nonaqueous solution as an electrolyte was described. Alternatively, the present application may be applied to a nonaqueous electrolysis secondary battery containing a solid electrolyte or a gel electrolyte.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:

1. A battery pack, comprising:
   at least one battery;
   a switch section which turns on and off charging to the battery;
   a measurement section which measures an open circuit voltage of the battery; and
   a deterioration level calculation section which calculates the deterioration level of the battery based on the open circuit voltage measured by the measurement section after the switch section has repeatedly turned on and off the charging 10 times or more.

2. The battery pack as set forth in claim 1, wherein the deterioration level calculation section calculates the deterioration level of the battery based on the open circuit voltage measured by the measurement section when a relative capacity of the battery is less than 70%.

3. The battery pack as set forth in claim 1, wherein the switch section turns on and off the charging to the battery at intervals of one second or less.

4. A method of calculating a deterioration level, comprising the steps of:
   after repeatedly turning on and off charging to at least one battery 10 times or more, measuring an open circuit voltage of the battery; and calculating the deterioration level of the battery based on the open circuit voltage.

5. The method as set forth in claim 4, wherein the deterioration level of the battery is calculated when a relative capacity of the battery is less than 70%.

6. The method as set forth in claim 4, wherein the switch section turns on and off the charging to the battery at intervals of one second or less.

* * * * *